United States Patent [19]

Arai et al.

[11] Patent Number: 4,965,174

[45] Date of Patent: Oct. 23, 1990

[54] RECORDING MEDIUM AND PROCESS FOR FORMING COLOR IMAGE WITH USE OF THE SAME

[75] Inventors: Ryuichi Arai, Sagamihara; Masahiro Haruta, Tokyo; Nobuko Yamamoto, Isehara; Tetsuya Yano, Atsugi; Hiroyoshi Kishi, Atsugi; Masanori Sakuranaga, Atsugi, all of Japan

[73] Assignee: Canon Kabushiki Kaisha, Tokyo, Japan

[21] Appl. No.: 447,066

[22] Filed: Oct. 24, 1989

Related U.S. Application Data

[63] Continuation of Ser. No. 105,211, Oct. 7, 1987, abandoned.

[30] Foreign Application Priority Data

Oct. 8, 1986 [JP] Japan .................................. 61-238142
Mar. 20, 1987 [JP] Japan .................................. 62-064044

[51] Int. Cl.$^5$ .......................... G03C 7/00; G03C 1/73
[52] U.S. Cl. ..................................... 430/340; 430/292; 430/346; 430/374; 430/541
[58] Field of Search .............. 430/346, 541, 340, 332, 430/334, 338, 374, 292, 495, 505, 503

[56] References Cited

U.S. PATENT DOCUMENTS

| | | | |
|---|---|---|---|
| 4,084,967 | 4/1978 | O'Brien | 430/541 |
| 4,314,021 | 2/1982 | O'Brien et al. | 430/270 |
| 4,356,256 | 10/1982 | O'Brien et al. | 430/332 |
| 4,386,145 | 5/1983 | Gilmour | 430/7 |
| 4,386,154 | 5/1983 | Smith et al. | 430/336 |
| 4,698,296 | 10/1987 | Lewis | 430/338 |
| 4,720,449 | 1/1988 | Borror et al. | 430/338 |

*Primary Examiner*—Paul R. Michl
*Assistant Examiner*—Mark R. Buscher
*Attorney, Agent, or Firm*—Fitzpatrick, Cella, Harper & Scinto

[57] ABSTRACT

A recording medium is provided which comprises a recording layer comprising at least one set of image-forming units containing a region holding a photosensitive protein and a color-developing means capable of developing a color according to a change in the hydrogen ion concentration in the region. Each of said image-forming units within the same set having a photosensitive protein sensitive to a different wavelength.

24 Claims, 4 Drawing Sheets

RECORDING MEDIUM AND PROCESS FOR FORMING COLOR IMAGE WITH USE OF THE SAME

This application is a continuation of application Ser. No. 105,211 filed Oct. 7, 1987, now abandoned.

BACKGROUND OF THE INVENTION

1. Field of the Invention

The present invention relates to a novel recording medium employing a plurality of photosensitive proteins each having a different photosensitive wavelength, and also to a process for forming a color image with use of this recording medium.

2. Related Background Art

Most general processes for forming a color image are known to include a silver salt color photographic process in which a silver halide (a silver salt), a sensitizing dye, a photocoupler dye and so forth are combined. This process can afford to obtain an image with high sensitivity, high resolution and high precision, but has a certain limit for achieving a low cost because exposure, developing and fixing processes are complicated or there is used expensive silver.

On the other hand, an electrophotographic process according to the so-called electrostatic recording has advantages such that it is simple in the process itself as compared with the silver salt color photographic process, and requires only a low running cost, but has also disadvantages such that the process can produce a color image only with difficulty, cannot readily give a highly precise image, or cannot present a halftone with ease.

In contrast to these processes, D. F. O'Brien U.S. Pat. Nos. 4,084,967 and 4,356,256 disclose an image formation process utilizing rhodopsin, as an image formation process utilizing a reaction in a living body.

The above D. F. O'Brien's image formation process utilizes the function of rhodopsin that is a substance present in the retina of a living body and capable of participating in the photosensing with a remarkably high sensitivity and resolution in the living body, and is effective for attaining a high amplification factor, high sensitivity or high resolution. However, this process can only be applied in the formation of a single color image, and there is no disclosure as to the formation of a full color image.

The present inventors have made intensive studies with an aim to utilize photosensitive proteins, including rhodopsin, for the formation of a full color image while making the most of the properties inherent therein, thus having accomplished the present invention.

SUMMARY OF THE INVENTION

An object of the present invention is to provide a recording medium for use in the full color image formation utilizing photosensitive proteins, and also a full color image formation process employing the same.

According to an aspect of the present invention, there is provided a recording medium comprising a recording layer, comprising at least one set of image-forming units containing (i) a region holding a photosensitive protein and (ii) a color-developing means capable of developing a color according to a change in the hydrogen ion concentration in said region; each of said image-forming units in one of said sets having a photosensitive protein sensitive to a different wavelength.

According to another aspect of the present invention, there is provided a recording medium comprising a recording layer, comprising at least one set of image-forming units containing (i) a lipid membrane holding a photosensitive protein and (ii) a color-developing means capable of developing a color according to a change in the hydrogen ion concentration in said region; each of said image-forming units in one of said sets having a photosensitive protein sensitive to a different wavelength.

According to still another aspect of the present invention, there is provided a recording medium comprising a recording layer comprising at least one set of image-forming units containing (i) a region holding a photosensitive protein and (ii) a color-developing means capable of developing a color according to a change in the hydrogen ion concentration in said region; the color developed by each unit in one of said sets being different from each other, and each of said photosensitive protein in said unit being sensitive to a different wavelength.

According to a further another aspect of the present invention, there is provided a process for forming a color image, comprising a step of irradiating light of a given wavelength according to the image information, on a recording medium comprising a recording layer comprising at least one image-forming units containing (i) a region holding a photosensitive protein and (ii) a color-developing means capable of developing a color according to a change in the hydrogen ion concentration in said region; each of said image-forming units in one of said sets having a photosensitive protein sensitive to a different wavelength.

According to a still further another aspect of the present invention, there is provided a process for forming a color image, comprising a step of irradiating light of a wavelength corresponding to a color to be developed in an image-forming unit and according to the image information, on a recording medium comprising a recording layer comprising at least one image-forming units containing (i) a region holding a photosensitive protein and (ii) a color-developing means capable of developing a color according to a change in the hydrogen ion concentration in said region; the color developed by each unit in one of said sets being different from each other and each of said photosensitive proteins in said unit being sensitive to a different wavelength.

BRIEF DESCRIPTION OF THE DRAWINGS

FIGS. 2 and 8 are partial cross-sections showing other embodiments of the recording medium of the present invention;

DETAILED DESCRIPTION OF THE PREFERRED EMBODIMENTS

Figure 1A:
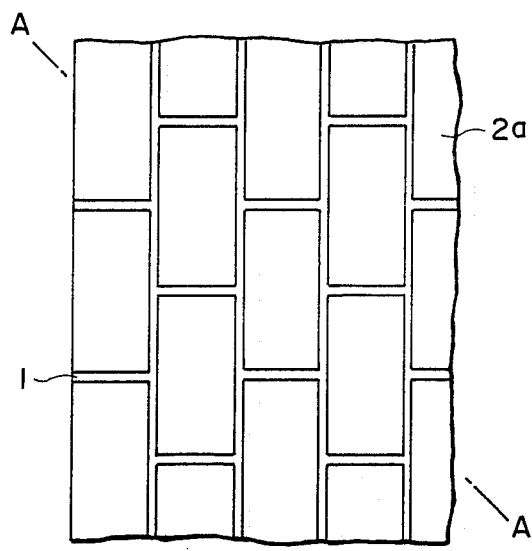
FIG. 1A is a partial plan view of the recording medium of the present invention.

A typical example of the photosensitive proteins used in the present invention include a visual pigment, which comprises opsin (a protein moiety) and retinal (a chromophore moiety), and is a substance participating in the photosensing function of an organism. It performs the acts of receiving light, converting it into any chemical change, and thereby producing a photic sense or other functions. Bacteriorhodopsin used in the present invention has a chromophore similar to the visual pigment and also has a function similar thereto. In the present invention, utilized is the function of receiving light and transporting hydrogen ions (i.e., a proton pump ability). Accordingly, as the photosensitive proteins used in the present invention, all sorts of photosensitive proteins can be utilized so long as they have the above function, and there is no limitation in the kind. Typical examples of these photosensitive proteins may include, for example, bacteriorhodopsin, poryphylopsin, iodopsin, etc.

As the photosensitive proteins used in the present invention, there can be utilized those obtained by extracted and purified from cells at a photosensing portion of an organism, for example, outer segment of visual cells in the retinas of animals, having every kind of the photic sense, or microorganisms having the photosensitivity. Among these, convenient as being readily available is bacteriorhodopsin which exists as a principal component of a purple membrane in cell membranes of halophilic bacteria and acts as a main body of its proton pump ability [W. Stoeckenius, R. A. Bogomolni, Ann. Rev. Biochem., 52, 587-616 (1982)], and which can be readily extracted from halophilic bacteria and purified by use of, for example, D. Questerhelt-W. Steichenium's method [Method in Enzymology, 31, 667-678 (1974)].

Two or more kinds having photosensitive wavelengths different from each other may be selected from such photosensitive proteins depending on the constitution of a desired recording medium.

It is also possible to form a derivative obtained by modifying the structure of a naturally occurring photosensitive protein separated from a living body, without impairing its function, to vary the photosensitive wavelength, and use it in the present invention.

Typically, it is possible to vary the photosensitive wavelength by making a change to the retinal moiety. To give examples for the formation of such a derivative of bacteriorhodopsin, there may be included, for example, the following instances:

The retinal moiety is modified into (a) all trans-retinal to give bacteriorhodopsin having an absorption maximum wavelength of 570 nm, [P. Townor, W. Gaerther et al, Eur. J. Biochem., 117, 353-359 (1981)];

(b) 13-cis-retinal to give bacteriorhodopsin having an absorption maximum wavelength of 550 nm [ditto];

(c) 5,6-dihydroretinal to give bacteriorhodopsin having an absorption maximum wavelength of 475 nm [R. Mao, R. Govinjee, et al, Biochemistry, 20, 428-435 (1981)];

(d) retro-γ-retinal to give bacteriorhodopsin having an absorption maximum wavelength of 430 nm [K. S. Huang, H. Baylay, et al, Fed. Proc., 40. 1659 (1981)];

(e) 3,4-dihydroretinal to give bacteriorhodopsin having an absorption maximum wavelength of 593 nm [F. Tokunaga, T. Ebrey, Biochemistry, 17, 1915-1922 (1978)]; etc.

The amino acid sequence of the bacteriorhodopsin has been already made clear [Yu. A. Ovchinnikov, N. G. Abdulaev, et al, Bioorg. Khim., 4, 1573 -1574 (1978)], and the base sequence of a gene of bacteriorhodopsin of halophilic bacteria has been also made clear by R. J. Dunn, J. M. McCoy, et al [Proc. Natl. Acad. Sci., 78, 6744-6748 (1981)].

Accordingly, also usable in the present invention is a bacteriorhodopsin obtained by effecting oblong and manipulating the base sequence of a bacteriorhodopsin gene to form a bacteriorhodopsin gene having a different absorption wavelength, constituting a recombinant DNA with use of it to form a host.

The color developing means in the present invention comprises a substance or reaction system capable of being colored in correspondence to a change in the hydrogen ion concentration occurring in the region containing the photosensitive protein, which is caused by hydrogen ions transported by the photosensitive protein having received light, and there can be used in the present invention those having the constitution in which various systems that can make visible a change in the hydrogen ion concentration or a change in the electrochemical potential are utilized, including, for example;

(a) those constituted by incorporating a substance capable of developing a desired color according to the change in the hydrogen ion concentration, into the region containing the above photosensitive protein or in a region contiguous to said region;

(b) those constituted by incorporating a specific enzyme being in an optimum pH range and pertaining in the reaction to develop a desired color, and a substance necessary for that color reaction, into the region containing the above photosensitive protein or in a region contiguous to said region; etc.

As examples of the above (a), there can be utilized the so-called pH indicators such as Cresol purple, Bromothymol Blue, Neutral Red, phenol Red, Cresol Red and α-naphtholphthalein, which can be used together with water.

To form the region holding the photosensitive protein, there can be utilized various fixation methods such as immobilization in a gel, a fixation using a binder and a method of fixing by encapsulation into a microcapsule, making use of a material therefor for example, collagen, polyacrylamide, cellulose, porous glass, etc.

The region holding photosensitive protein may be formed preferably by immobilizing the protein in a lipid membrane or immobilizing the protein together with a lipid as a composite membrane according to a Langmuir-Blodgette method.

In the recording medium of the present invention, the material for a lipid membrane for holding the photosensitive protein may be a known amphiphilic compound capable of forming a monomolecular or multimolecular film. Such lipid molecules capable of forming a film have a long alkyl of carbon number of 8 or more and a hydrophilic group.

The hydrophilic group may be a cation such as:

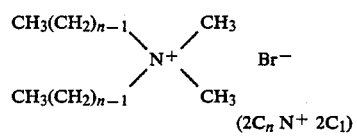

an anion such as:

-continued

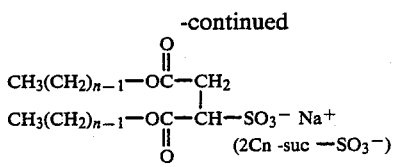

(2Cn -suc —SO$_3^-$)

a non-ion such as:

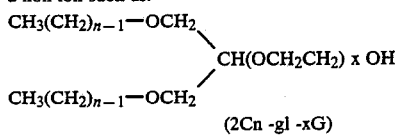

(2Cn -gl -xG)

or a zwitter ion such as:

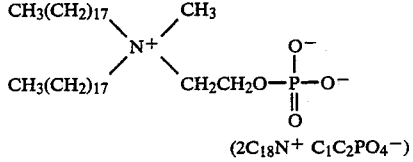

(2C$_{18}$N$^+$ C$_1$C$_2$PO$_4^-$)

Among the lipid materials, specially suitable ones for forming a lipid membrane holding an above-mentioned photosensitive protein by incorporating the protein therein to function efficiently are lipids constituting biomembrane as follows: a glycerophospholipid such as phosphatidylcholine (lecithin), phosphatidylethanolamine and diphosphatidylglycerol; sphingophospholipid such as sphingomyelin and ceramic ciliatin; sphingoglycolipid such as cerebroside, sulfamide, and ceramide oligohexoside; glyceroglycolipid such as glycosyldiacylglycerol containing carbohydrate as a hydrophilic group.

The materials for lipid membrane of the present invention may be those formed from the above mentioned lipid materials and constituted of a monomolecular film of a lipid, those constituted of a two-layer lamination of monomolecular film of a lipid (lipid double-layer membrane), or those constituted of three of more lamination of monomolecular film of a lipid.

Above all, a photosensitive protein held within a lipid double-layer membrane is convenient since the photosensitive protein can be reconstructed in a form analogous to a construction in a living body.

In order to cause the photosensitive protein to act, it is necessary for the region holding the photosensitive protein to further hold water, which can be incorporated into said region at the time of the formation of the region holding the photosensitive protein or, after the formation, at the time, e.g., the recoding medium is used.

The fixation method mentioned above can be also utilized in the case the color-developing means is formed independently from the region holding the photosensitive protein.

The constitution of the recording medium of the present invention and the image formation process employing it will be described below in detail with reference to the accompanying drawings.

FIG. 1A is a typical plan view showing an example for the constitution of the recording medium of the present invention, and FIG. B is a typical cross-section along the line A—A in FIG. 1A.

In the recording medium of this example, constituted is a substrate 1 provided thereon with a recording layer 2 in which a plurality of mosaic-like image forming units 2a each comprising two layers consisting of a color-developing layer 2aa constituting the color-developing means mentioned in the present invention and a photosensitive layer 2ab holding the photosensitive protein is arranged in such a manner that the units are mixed so as to be adjacent to each other.

The recording layer 2 comprises sets of unit in combination. The color-developing layer of each of the units within the set develops different color from each other, and the photosensitive protein has a sensitive wavelength corresponding to the color to be developed.

The color-developing layer 2aa comprises the above substance or reaction system capable of developing a color according to a change in the hydrogen ion concentration, such as the pH indicator, incorporated, for example, in the gel mentioned above, and is provided on the substrate in a given pattern.

The photosensitive layer 2ab comprises the photosensitive protein incorporated, for example, in the gel mentioned above, and is provided on the color-developing layer 2aa in a pattern corresponding thereto.

The kind of the image-forming unit and the number of the color developed therein, or the shape or size thereof may be appropriately selected depending on the use of the recording medium. For example, if two kinds of image-forming units each developing a different color are used by mixedly arranging them, it is possible to present four kinds of colors (including non-color). If three kinds of image-forming units each developing a different color are used by mixedly arranging them, it is possible to present eight kinds of colors (including non-color). It is further possible to use three kinds or more of image-forming units containing the combination of the three primary colors of, for example, R (red), G (green) and B (blue) or Y (yellow), M (magenta) and C (cyan) to obtain a full color image.

On the other hand, the relation between the sensitive wavelength of the photosensitive protein in a certain image-forming unit with the color to be developed in the color-developing layer may be controlled, for example, in a manner such that;

(a) the photosensitive wavelength characteristics of the photosensitive protein and the color development characteristics of the color to be developed in the color-developing layer may be made to directly correspond to each other, e.g., a photosensitive protein sensitive to red light and a color-developing layer which develops red color are combined, so that a color having wavelength characteristics corresponding to the wavelength characteristics of light can be directly developed in the image forming unit to obtain a positive color image; or (b) the photosensitive wavelength characteristics of the photosensitive protein and the color development characteristics of the color to be developed in the color-developing layer may be made to correspond to each other in a complementary relation, e.g., a photosensitive protein sensitive to red light and a color-developing layer which develops cyan color are combined, so that a color having wavelength characteristics corresponding to the wavelength characteristics of light in a complementary relation can be developed in the image-forming unit to obtain a negative color image.

However, as the photosensitive wavelength of the photosensitive protein, there may not necessarily be used the one directly corresponding like this to the color to be developed in the color-developing layer. Instead, the light having the photosensitive wavelength of the photosensitive protein incorporated in the image-forming unit may be irradiated by selecting it according to the recording image information, in other words, the light containing the photosensitive wavelength of the photosensitive protein incorporated in the image-forming unit intended to be color-developed may be selectively irradiated, so that there can be formed a color image corresponding to the recording image information.

The respective components used when the image-forming unit 2a is formed may be contained in concentration of such a level that a change in the hydrogen ion concentration can be obtained in such a degree that the color is sufficiently developed in the color-developing means, and also the respective reactions can favorably proceed.

In order to obtain the change in the hydrogen ion concentration by the photosensitive protein, there must exist sufficient moisture. For example, in the case of the fixation by using the gel, it is necessary to control the moisture content to at least 15%. preferably 25% or more.

Needless to say, in the region containing the photosensitive protein or the region constituting the color-developing means, their physical, chemical or biochemical environmental factors such as pH and osmotic pressure should be appropriately conditioned so that these means can sufficiently function.

The substrate 1 can be produced as desired, from resins such as triacetate and polyester, or glass, ceramics, metals, paper, etc.

Figure 1B:
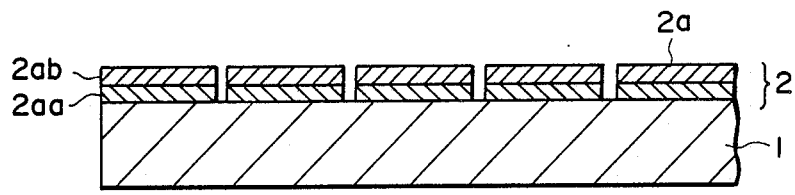
FIG. 1B is a partial cross section along the line A—A in FIG. 1A.

In the above example shown in FIG. 1, the photosensitive layer and the color developing layer are separated into two layers, but the recording medium of the present invention may not be limited to such construction. They may be constructed so as to be held in a same layer or may have a multi-layer construction in which a plurality of the photosensitive layer and the color-developing layer is laminated in a desired order.

A process for forming a color image with use of the recording medium having such construction will be described below with reference to the drawings.

Figure 2:
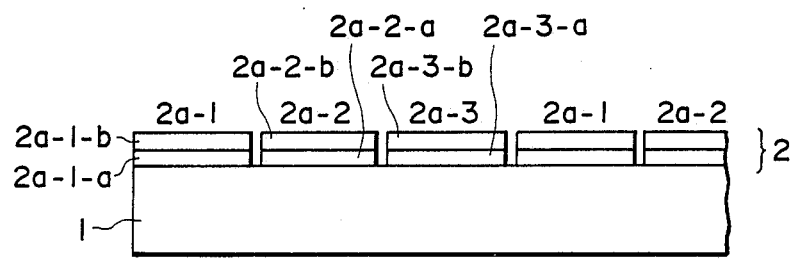

FIG. 2 is a typical cross-section showing an example of the recording medium having the constitution as shown in FIG. 1, comprising a recording layer formed by making the photosensitive wavelength characteristics of the photosensitive protein in a certain image-forming unit, coincident with the color development characteristics of the color-developing layer. Accordingly, a positive image can be obtained in this instance.

In this example, the color to be developed in the color-developing layer 2a-1-a in the image-forming unit 2a-1 is R (red), and the photosensitive layer 2a-1-b holds a red-sensitive photosensitive protein. Similarly, the color-developing layer 2a-2-a the image-forming unit 2a-2 can take on G (green), and the photosensitive layer 2a-2-b thereof holds a green-sensitive photosensitive protein. The color-developing layer 2a-3-a of the image-forming unit 2a-3 can take on B (blue), and the photosensitive layer 2a-3-b thereof holds a blue-sensitive photosensitive protein.

To perform the image formation using this recording medium, moisture is supplied by, e.g., wetting the recording layer with water if any sufficient moisture is not contained previously in the recording layer.

Next, light is irradiated on the recording layer according to image information.

In this irradiation, there can be applied, for example, a method in which a positive color original having a desired transmittance is laid overlapping on the recording layer and white light is irradiated on it, or a method in which red light, green light and blue light are successively irradiated while selecting the portions to be irradiated, according to the information obtained by resolving a desired color image to the three primary colors of R, G and B.

Then, in each of the photosensitive layers, the photosensitive protein is rendered sensitive according to the wavelength characteristics of the light irradiated on each portion, where hydrogen ions are split off to change the hydrogen ion concentration. As a result, the color-developing layer develops a color according to the change in the hydrogen ion concentration.

Specifically, for example, at the portion irradiated with only red light, only the image-forming unit 2a-1 develops the color, which portion is presented in red. Similarly, the portion irradiated with only green (or blue) light is presented in green (or blue). At the portion irradiated with yellow light, i.e., the light having the wavelength characteristics of both red light and green light, the image-forming units 2a-1 and 2a-2 develop colors, which portions are presented in yellow. Similarly, a full color image can be formed by the combination of the three primary colors, R, G and B.

Figure 3:
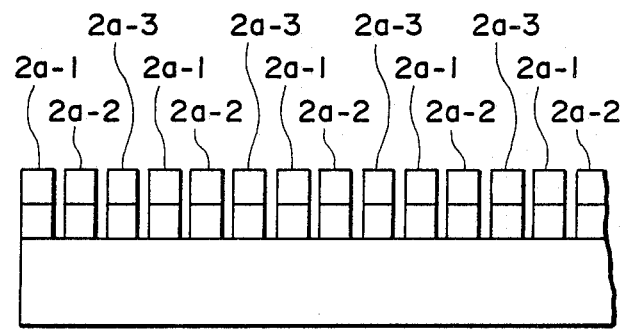

On the other hand, FIG. 3 shows an example of the recording medium of the present invention in the case that there is no direct relationship as in the example shown in FIG. 2, between the photosensitive wavelength characteristics of the photosensitive protein and the wavelength characteristics of the color in the color-developing layer.

Namely, although the colors developed in the three kinds of image-forming units are same as the example shown in FIG. 1, the photosensitive wavelengths of the photosensitive proteins held in the respective photosensitive layers are $\lambda_1$, $\lambda_2$ and $\lambda_3$, respectively.

Figure 4A:
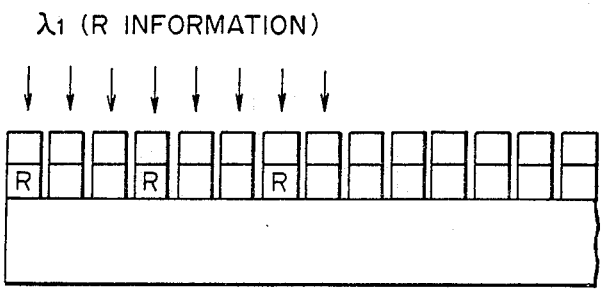
FIGS. 4A to 4C are illustrations showing a process of the irradiation of light in the image formation process of the present invention employing the recording medium shown in FIG. 3.
Figure 4B:
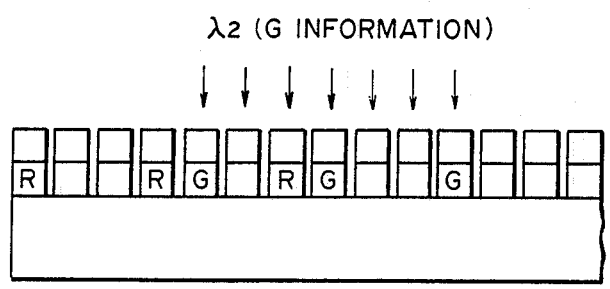
Figure 4C:
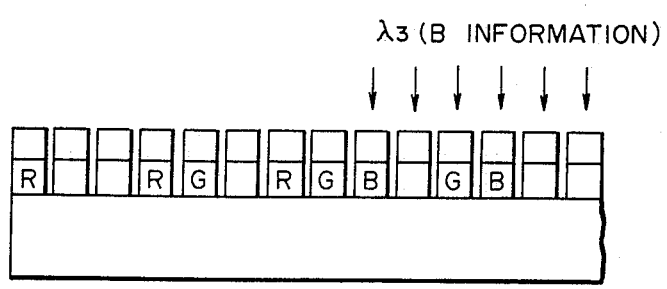

In this recording medium, as shown in FIG. 4A to FIG. 4C, the light having the wavelength of $\lambda_1$, $\lambda_2$ or $\lambda_3$ is successively irradiated according to the information obtained by resolving a color image into the three primary colors of R, G and B. Specifically, the exposure by the light of $\lambda_1$ is selectively performed on the basis of the information relating to R. Similarly, the light having the wavelength of $\lambda_2$ and the light having the wavelength of $\lambda_3$ are selectively irradiated on the bases of the information relating to G and B, respectively.

Thus, following the color developing processes similar to those described in respect of FIG. 1, there can be formed a color image comprising three color mosaics as shown in FIG. 4C (wherein the color-developed portions are indicated using alphabets).

According to the present invention, it was made possible to form a color image with high sensitivity and high resolution, effectively utilizing the properties of the photosensitive protein. This has been hitherto impossible.

Also, in the recording medium of the present invention, the combination of the photosensitive wavelength of the photosensitive protein with the color to be developed in the color-developing means may be selected, whereby a full color image can be readily formed with ease by a simple exposure method using a light-transmissive positive color original.

The present invention will be described below in greater detail by Examples.

EXAMPLE 1

On a polyester film serving as a substrate, a red color developing layer 2a-1-a (R) with a mosaic pattern as shown in FIG. 2 was formed by fixation of Neutral Red by use of a polyacrylamide gel.

Next, on the above substrate, a green color developing layer 2a-2-a (G) of FIG. 2 was formed by fixation of Methyl Green by use of a polyacrylamide gel and in the same manner as the patterning in the color-developing layer (R).

On the above substrate, a blue color developing layer 2a-3-a (B) of FIG. 2 was further formed by fixation of Nile Blue by use of a polyacrylamide gel and with the patterning same as above.

Subsequently, the aforesaid 3,4-dihydroretinal type bacteriorhodopsin was laminated on the color-developing layer (R) to obtain the photosensitive layer 2a-1-b.

Similarly, using 13-cis-retinal type bacteriorhodopsin in place of 3,4-dihydroretinal type bacteriorhodopsin, the photosensitive layer 2a-2-b was formed on the color-developing layer (G), and using 5,6-dihydroretinal type bacteriorhodopsin in place of 3,4-dihydroretinal type bacteriorhodopsin, the photosensitive layer 2a-3-b was formed on the color-developing layer (B), respectively, to obtain a recording medium of the present invention.

The recording medium formed in the above manner was wetted with water. Thereafter, a desired light-transmissive positive color original (5 cm × 5 cm) was laid overlapping on its recording layer, and white light was irradiated from its upper surface for 5 minutes.

As a result, there was formed a color image corresponding to the original and comprising a fine mosaic pattern of R, G and B.

EXAMPLE 2

Purple membrane extracted from a *Halobacterium halobium* R1 strain by use of the previously mentioned D. Qesterhelt et al's method was treated with Triton X-100 according to the previously mentioned K. S. Huang et al's method. Lipid was removed from the resulting purple membrane to obtain the membrane protein bacteriorhodopsin.

Next, 170 mg of asolectin (soybean phospholipid) purified by Y. Kagawa et al's method [J. Biol. Chem., 246, 5477 (1971)] were treated to dryness in a nitrogen gas atmosphere, to which 16 ml of an aqueous 0.15M KCl solution containing 2% of sodium cholate was added until the aqueous sodium cholate solution turned perfectly transparent, followed by carrying out ultrasonic treatment for about 15 minutes immediately after the ultrasonic treatment was completed, 3.2 mg of the bacteriorhodopsin already obtained were added in this treated solution.

In the treated solution obtained here, 10 ml of an aqueous solution containing 0.02% of Methyl Green were added and thoroughly stirred. Thereafter, this aqueous solution was dialyzed against 1 liter of an aqueous 0.15M KCl solution (adjusted to pH 7.0 with NaOH) containing 0.025% of sodium azide, using a cellophane tube (produced by Union Carbide Corp.) as a dialysis membrane.

The dialysis was carried out for about 24 hours while changing an outside solution (an aqueous 0.15M KCl solution containing 0.025% of sodium azide) for a new one at intervals of several hours, and until the pH of the outside solution was settled at 7.0.

Thus, in the solution inside the dialysis membrane, it was possible to obtain proteoliposome in which Methyl Green was adsorbed on its outer wall and bacteriorhodopsin was held inside the membrane.

Next, according to a similar method, proteoretinal containing 3,4-dihydroretinal or 5,6-dihydroretinal in place of 13-cis-retinal, and Neutral Red or Nile Blue in place of Methyl Green was produced, respectively.

The proteoliposomes thus obtained are rendered sensitive to green (G), red (R) and blue (B), respectively, and develop the corresponding colors.

Figure 5:
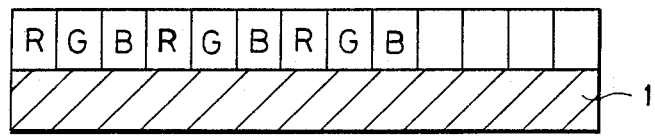
FIGS. 5 to 7 are partial cross sections showing further embodiments of the recording medium of the present invention.

By fixation of these three kinds of proteoliposomes by respectively using a polyacrylamide gel, a mosaic pattern as shown in FIG. 5 was formed on a polyester film to obtain a recording medium of the present invention.

The recording medium formed in the above manner was wetted with water. Thereafter, a desired light-transmissive positive color original (5 cm × 5 cm) was laid overlapping on its recording layer, and white light was irradiated from its upper surface for minutes.

As a result, there was formed a color image corresponding to the original and comprising a fine mosaic pattern of R, G and B.

EXAMPLE 3

In the same manner as in Example 2, there were obtained three kinds of proteoliposomes (R), (G) and (B) each comprising a photosensitive layer and a color-developing layer integrally formed.

Figure 6:
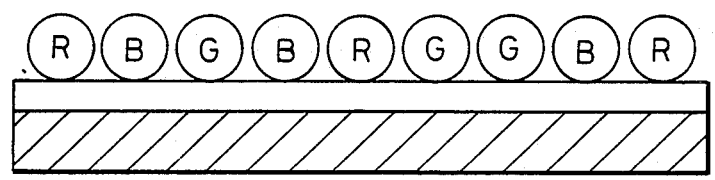

These three kinds of proteoliposomes were mixed, and fused and adsorbed on a membrane filter (a nitrocellulose filter: produced by Toyo Roshi Co. pore size: 0.45 μm) beforehand treated by dipping it in a decane solution (10 mg/ml) of asolectin, without patterning as shown in FIG. 6.

The recording medium formed in the above manner was wetted with water. Thereafter, a desired light-transmissive positive color original (5 cm × 5 cm) was laid superposing on its recording layer, and white light was irradiated from its upper surface for 5 minutes.

As a result, there was formed a color image corresponding to the original and comprising a fine mosaic pattern of R, G and B.

EXAMPLE 4

First, a hexane/ethanol mixed solvent (9:1, v/v) containing 1 mM of a phospholipid asolectin, was spread in Langmuir's water tank. Next the surface pressure of an asolectin monomolecular membrane spread over the water surface was kept to 40 dyn/cm$^2$, and a glass sheet having been not alkylated was held vertically, which was slowly inserted under the water surface. Thereafter, this glass sheet, as it was kept vertical, was slowly drawn up from the water tank to obtain a monomolecular membrane on which asolectin hydrophilic groups were oriented toward the direction of the glass sheet.

Next, an aqueous solution containing a 1 mM of proteoliposome containing the bacteriorhodopsin obtained in Example 2 was spread in Langmuir's later tang. Operating like this, the proteoliposome was destroyed, and a lipid monomolecular membrane containing bacteriorhodopsin was formed at the gas-liquid interface. Keeping the surface pressure of this monomolecular membrane to about 40 dyn/cm$^2$, the glass sheet having the asolectin monomolecular membrane previously formed was held horizontal, and laid superposing from the upper side on the monomolecular membrane formed in the Langmuir's water tank and with the interposition of the asolectin monomolecular membrane formed surface, to form a monomolecular built-up planer membrane carrying the bacteriorhodopsin containing lipid monomolecular membrane on the asolectin monomolecular membrane.

Finally, the resulting monomolecular built-up membrane was adjusted to the pH of 7.0, and thereafter its surface was brought into contact with an aqueous solution containing 0.02% of Methyl Green to allow Methyl Green to be adsorbed there, thus obtaining a recording medium.

On this base on which an LB membrane which is a photosensitive color-developing layer (G) comprising Methyl Green adsorbed on its surface is adsorbed, and containing 13-cis retinal, an asolectin monomolecular membrane was placed in the same manner, and a proteoliposome containing 3,4-dihydroretinal type bacteriorhodopsin was spread thereon in place of the bacteriorhodopsin containing 13-cis retinal, to form a photosensitive layer (R).

The surface of the resulting monomolecular built up membrane was brought into contact with an aqueous solution containing 0.02% of Neutral Red to allow Neutral Red to be adsorbed there, thus obtaining a photosensitive color-developing layer (R).

Figure 7:
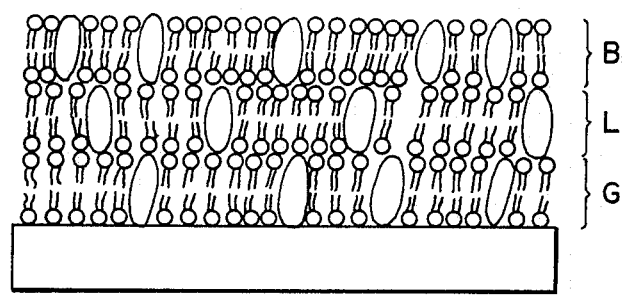

Using 5,6-dihydroretinal type bacteriorhodopsin in place of 3,4-dihydroretinal type bacteriorhodopsin, and Nile Blue in place of Neutral Red, a photosensitive color-developing layer (B) was further formed in the same manner to obtain a recording medium as shown in FIG. 7.

Meanwhile, the order of laminating the photosensitive color developing layers (R), (G) and (B) may not be limited to this order.

We claim:

1. A recording medium including a recording layer comprising a mosaic-like set of image-forming units, each image-forming unit comprising a first region containing a bacteriorhodopsin or derivative thereof and a second region containing a color-former responsive to change in hydrogen ion concentration where the bacteriorhodopsins or derivatives thereof contained in each unit have a photosensitive wavelength selected from a plurality of wavelengths.

2. A recording medium according to claim 1, wherein each unit develops a red, green or blue color.

3. A recording medium according to claim 1, wherein the color-former is a pH indicator.

4. A recording medium according to claim 1, wherein the color-former is held by a polyacrylamide gel.

5. A recording medium according to claim 1, wherein the bacteriorhodopsin or derivative thereof is held by a lipid membrane.

6. A recording medium including a recording layer comprising a mosaic-like set of image-forming units, each image-forming unit comprising a first region containing a bacteriorhodopsin or derivative thereof and water and a second region containing a color-former responsive to change in hydrogen ion concentration and water where the bacteriorhodopsins or derivatives thereof contained in each unit have a photosensitive wavelength selected from a plurality of wavelengths.

7. A recording medium according to claim 6, wherein each unit develops a red, green or blue color.

8. A recording medium according to claim 6, wherein the color-former is pH indicator.

9. A recording medium according to claim 6, wherein the color-former is held by a polyacrylamide gel.

10. A recording medium according to claim 6, wherein the bacteriorhodopsin or derivative thereof is held by a lipid membrane.

11. A color image-forming method comprising the steps of imparting water to a recording medium including a recording layer comprising a mosaic-like set of image-forming units, each image-forming unit comprising a first region containing a bacteriorhodopsin or derivative thereof and a second region containing a color-former responsive to change in hydrogen ion concentration where, the bacteriorhodpsins or derivatives thereof contained in each unit have a photosensitive wavelength selected from a plurality of wavelengths; and irradiating the recording medium with light having a specified wavelength.

12. A recording medium according to claim 11, wherein each unit develops a red, green or blue color.

13. A recording method according to claim 11, wherein the color-former is a pH indicator.

14. A recording method according to claim 11, wherein the color-former is held by a polyacrylamide gel.

15. A recording medium according to claim 11, wherein the bacteriorhodpsin or derivative thereof is held by a lipid membrane.

16. A color image-forming method comprising the steps of imparting water to a recording medium including a recording layer comprising a mosaic-like set of image-forming units, each image-forming unit comprising a first region containing a bacteriorhodpsin or derivative thereof and water and a second region containing a color-former responsive to change in hydrogen ion concentration and water where the bacteriorhodpsins or derivatives thereof contained in each unit have a photosensitive wavelength selected from a plurality of wavelengths; and irradiating the recording medium with light having a specified wavelength.

17. A recording method according to claim 16, wherein each unit develops a red, green or blue color.

18. A recording method according to claim 16, wherein the color-former is a pH indicator.

19. A recording method according to claim 16, wherein the color-former is held by a polyacrylamide gel.

20. A recording method according to claim 16, wherein the bacteriorhodpsin or derivative thereof is held by a lipid membrane.

21. A recording medium including a recording layer comprising a mosaic-like set of image forming units, each image-forming unit comprising a lipid membrane having therein (a) a bacteriorhodpsin or derivative thereof, and (b) a color-former responsive to change in hydrogen ion concentration where the bacteriorhodpsin or derivative thereof contained in each unit has a photosensitive wavelength selected from a plurality of wavelengths.

22. A recording medium according to claim 21, wherein each unit develops a red, green or blue color.

23. A recording medium according to claim 21, wherein the color-former is a pH indicator.

24. A recording medium according to claim 21, wherein the color-former is held by a polyacrylamide gel.

* * * * *

UNITED STATES PATENT AND TRADEMARK OFFICE
CERTIFICATE OF CORRECTION

PATENT NO. : 4,965,174

DATED : October 23, 1990

INVENTOR(S) : RYUICHI ARAI, ET AL.

It is certified that error appears in the above-identified patent and that said Letters Patent is hereby corrected as shown below:

COLUMN 1

Line 60, "aspect-of" should read --aspect of--.

COLUMN 2

Line 22, "another" should be deleted.
    Line 34, "another" should be deleted.
    Line 54, "FIGS. 2 and 8" should read --FIGS. 2 and 3--.

COLUMN 3

Line 19, "tracted" should read --traction--.
    Line 48, "all trans-retinal" should read
        --all-trans-retinal--.

COLUMN 4

Line 5, "oblong" should read --cloning--.
    Line 10, "color developing" should read
        --color-developing--.
    Line 37, "phenol Red," should read --Phenol Red,--.
    Line 45, "therefor" should read --therefor including,--
    Line 51, "Langmuir-Blodgette" should read
        --Langmuir-Blodgett--.

UNITED STATES PATENT AND TRADEMARK OFFICE
CERTIFICATE OF CORRECTION

PATENT NO. : 4,965,174

DATED : October 23, 1990

INVENTOR(S) : RYUICHI ARAI, ET AL.

It is certified that error appears in the above-identified patent and that said Letters Patent is hereby corrected as shown below:

COLUMN 5

Line 39, "three of" should read --three or--.

COLUMN 6

Line 5, "unit" should read --units--.
    Line 7, "color" should read --colors--.

COLUMN 7

Line 53, "layer 2a-2-a the" should read
        --layer 2a-2-a of the--.

COLUMN 9

Line 52, "15 minutes immediately" should read
        --15 minutes.   Immediately--.

COLUMN 10

Line 59, "later" should read --water--.
    Line 60, "tang." should read --tank.--.

COLUMN 11

Line 66, "pH indicator" should read --a pH indicator--.

UNITED STATES PATENT AND TRADEMARK OFFICE
CERTIFICATE OF CORRECTION

PATENT NO. : 4,965,174

DATED : October 23, 1990

INVENTOR(S) : RYUICHI ARAI, ET AL.

It is certified that error appears in the above-identified patent and that said Letters Patent is hereby corrected as shown below:

COLUMN 12

Line 13, "where, the bacteriorhodpsins" should read --where the bacteriorhodopsins--.
Line 18, "medium" should read --method--.
Line 25, "medium" should read --method--.
Line 26, "bacteriorhodpsin" should read --bacteriorhodopsin--.
Line 32, "bacteriorhodpsin" should read --bacteriorhodopsin--.
Line 35, "bacteriorhodpsins" should read --bacteriorhodopsins--.
Line 48, "bacteriorhodpsin" should read --bacteriorhodopsin--.
Line 53, "bacteriorhodpsin" should read --bacteriorhodopsin--.
Line 55, "bacteriorhodp-" should read --bacteriorhodop- --.

Signed and Sealed this

Eighteenth Day of June, 1991

*Attest:*

HARRY F. MANBECK, JR.

*Attesting Officer*

*Commissioner of Patents and Trademarks*